United States Patent
Chuang et al.

(10) Patent No.: US 9,786,542 B2
(45) Date of Patent: Oct. 10, 2017

(54) MECHANISMS FOR FORMING SEMICONDUCTOR DEVICE HAVING ISOLATION STRUCTURE

(71) Applicant: Taiwan Semiconductor Manufacturing Co., Ltd., Hsin-Chu (TW)

(72) Inventors: Zih-I Chuang, New Taipei (TW); Chun-Ta Wu, Sanyi Township (TW); Chia-Lun Chang, Changhua (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/153,593

(22) Filed: Jan. 13, 2014

(65) Prior Publication Data
US 2015/0200127 A1   Jul. 16, 2015

(51) Int. Cl.
H01L 21/762  (2006.01)
H01L 21/324  (2006.01)
H01L 29/06   (2006.01)
H01L 29/66   (2006.01)
H01L 29/78   (2006.01)

(52) U.S. Cl.
CPC ...... *H01L 21/76205* (2013.01); *H01L 21/324* (2013.01); *H01L 21/76224* (2013.01); *H01L 29/0642* (2013.01); *H01L 29/66795* (2013.01); *H01L 29/7851* (2013.01)

(58) Field of Classification Search
CPC ........... H01L 21/76224; H01L 29/0649; H01L 29/6656; H01L 21/76898; H01L 21/823481; H01L 21/02271; H01L 21/76232; H01L 21/76831; H01L 21/823878; H01L 21/0234; H01L 21/76; H01L 21/76205; H01L 21/324; H01L 29/0642
See application file for complete search history.

(56) References Cited

U.S. PATENT DOCUMENTS

| | | | | |
|---|---|---|---|---|
| 6,566,229 B2* | 5/2003 | Hong | ............ | H01L 21/76224 257/E21.546 |
| 7,622,369 B1* | 11/2009 | Lee | ............ | H01L 21/02126 257/E21.545 |
| 7,682,977 B2* | 3/2010 | Li | ............ | H01L 21/76224 257/642 |
| 7,947,551 B1 | 5/2011 | Syue et al. | | |
| 8,772,904 B2* | 7/2014 | Liu | ............ | H01L 21/76224 257/510 |
| 2002/0123206 A1 | 9/2002 | Hong et al. | | |
| 2004/0152342 A1 | 8/2004 | Li et al. | | |
| 2004/0248374 A1* | 12/2004 | Belyansky | ........ | H01L 21/76229 438/428 |

(Continued)

*Primary Examiner* — Moazzam Hossain
*Assistant Examiner* — Farun Lu
(74) *Attorney, Agent, or Firm* — Birch, Stewart, Kolasch & Birch, LLP

(57) ABSTRACT

Embodiments of mechanisms for forming a semiconductor device are provided. The semiconductor device includes a semiconductor substrate having an upper surface. The semiconductor device also includes a recess extending from the upper surface into the semiconductor substrate. The semiconductor device further includes an isolation structure in the recess, and the isolation structure has an upper portion and a lower portion.

20 Claims, 4 Drawing Sheets

(56) References Cited

U.S. PATENT DOCUMENTS

| | | | |
|---|---|---|---|
| 2005/0059245 A1* | 3/2005 | Spencer | H01L 21/02126 438/689 |
| 2007/0207590 A1 | 9/2007 | Kiyotoshi et al. | |
| 2007/0238310 A1* | 10/2007 | Matsuda | H01L 21/02063 438/758 |
| 2007/0281496 A1* | 12/2007 | Ingle et al. | 438/778 |
| 2009/0298257 A1 | 12/2009 | Lee et al. | |
| 2010/0035404 A1 | 2/2010 | Li | |
| 2010/0230741 A1 | 9/2010 | Choi et al. | |
| 2011/0151678 A1 | 6/2011 | Ashtiani et al. | |
| 2012/0034757 A1 | 2/2012 | Choi et al. | |
| 2013/0334650 A1 | 12/2013 | Liu et al. | |
| 2014/0187045 A1* | 7/2014 | Hua et al. | 438/694 |
| 2014/0191358 A1* | 7/2014 | Liou | H01L 21/76235 257/506 |
| 2014/0329027 A1* | 11/2014 | Liang | C23C 16/401 427/551 |

* cited by examiner

MECHANISMS FOR FORMING SEMICONDUCTOR DEVICE HAVING ISOLATION STRUCTURE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased.

Such advances have increased the complexity of processing and manufacturing ICs. For these advances, similar developments in IC processing and manufacturing are developed accordingly. Along with the advantages realized from reducing geometric size, improvements are being made directly to the IC devices. However, since the feature sizes continue to decrease, fabrication processes continue to become more difficult to perform.

Therefore, it is a challenge to form reliable semiconductor devices with smaller and smaller sizes.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1A:
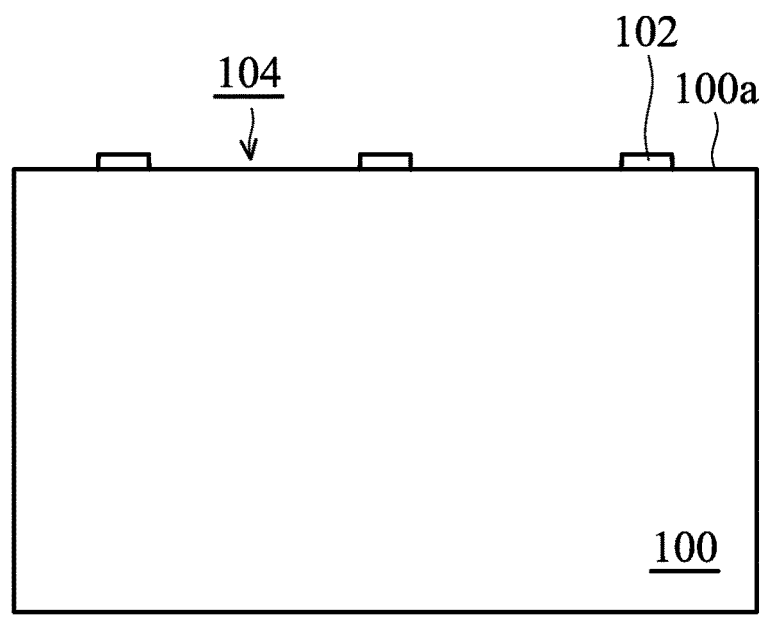
FIGS. 1A-1G are cross-sectional views of various stages of a process for forming a semiconductor device, in accordance with some embodiments.

FIGS. 1A-1F are cross-sectional views of various stages of a process for forming a semiconductor device, in accordance with some embodiments. Referring to FIG. 1A, a semiconductor substrate 100 having an upper surface 100a is provided. In some embodiments, the semiconductor substrate 100 includes a bulk silicon substrate which is doped or undoped, a semiconductor on insulator (SOI) substrate, or other suitable semiconductor substrates. The SOI substrate includes an active layer of a semiconductor material on insulator. The semiconductor material includes, for example, silicon, germanium, silicon germanium, or the like. In some embodiments, the semiconductor substrate 100 is a semiconductor wafer, such as a silicon wafer. Alternatively, in some other embodiments, the semiconductor substrate 100 includes a multi-layered substrate, gradient substrate, hybrid orientation substrate, or the like.

Afterwards, a mask layer 102 is formed over the semiconductor substrate 100, as shown in FIG. 1A in accordance with some embodiments. The mask layer 102 has openings 104 which expose the semiconductor substrate 100. In some embodiments, the mask layer 102 includes a hard mask. For example, the hard mask is made of silicon nitride, silicon oxynitride, silicon oxide, silicon carbide, other suitable materials, or a combination thereof. A chemical vapor deposition (CVD) process is performed to deposit a hard mask layer over the semiconductor substrate in some embodiments. Afterwards, the hard mask layer is patterned through suitable photolithography and etching processes to form the mask layer 102 having the openings 104.

Figure 1B:
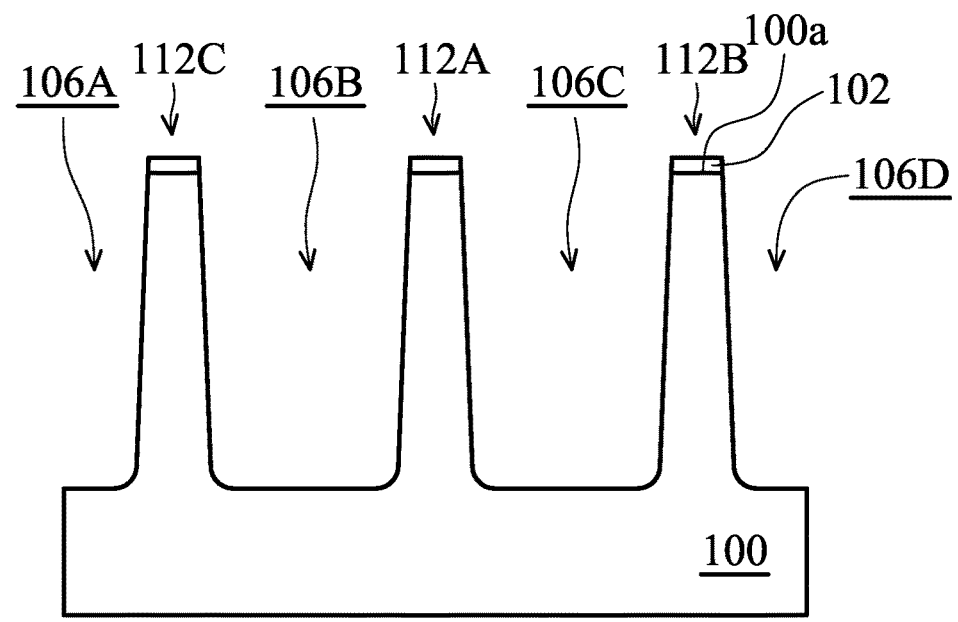

As shown in FIG. 1B, one or more recesses (such as recesses 106A, 106B, 106C, and 106D) are formed in the semiconductor substrate 100, in accordance with some embodiments. In some embodiments, the semiconductor substrate 100 is partially removed to form the recesses 106A, 106B, 106C, and 106D. The recesses 106A, 106B, 106C, and 106D extend from the upper surface 100a into the semiconductor substrate 100 to separate and define various active regions of the semiconductor substrate 100. For example, the active regions include active regions 112A, 112B and 112C, as shown in FIG. 1B. In some embodiments, by using the mask layer 102 as an etching mask, an etching process, such as reactive ion etching (RIE), is performed to form the recess 106. In some embodiments, the recesses 106A, 106B, 106C, and 106D are trenches.

In some embodiments, each of the aspect ratios of the recesses 106A, 106B, 106C, and 106D is higher than about 8.5. In some embodiments, the aspect ratio is in a range from about 8.5 to about 40.

Figure 1C:
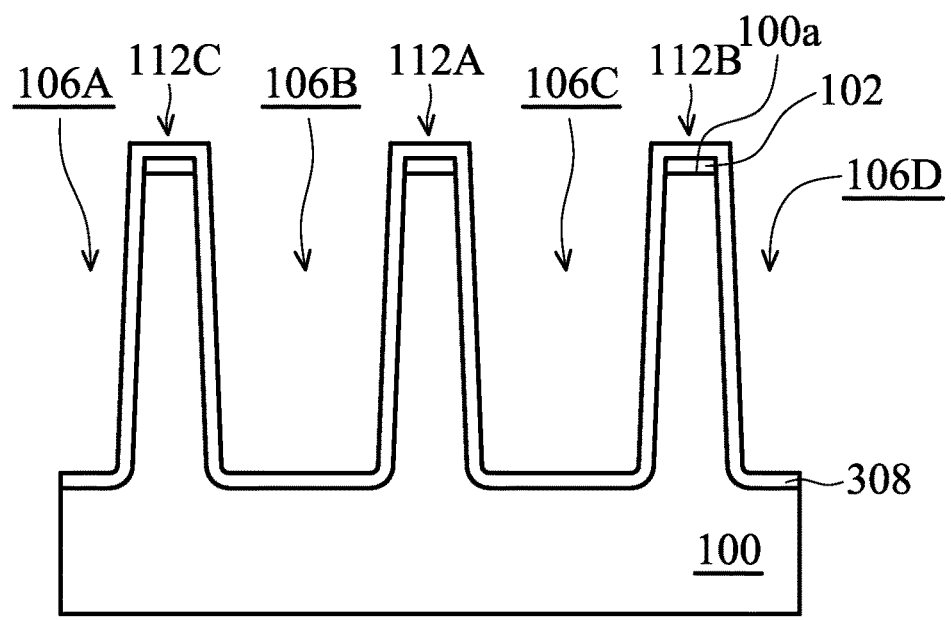

As shown in FIG. 1C, a liner layer 308 is deposited over the mask layer 102 and sidewalls and bottoms of the recesses 106A, 106B, 106C, and 106D, in accordance with some embodiments. In some embodiments, the liner layer 308 is deposited in a conformal manner. In some embodiments, the liner layer 308 includes a material which will expand after being annealed.

In some embodiments, the liner layer 308 is made of a suitable semiconductor material, a suitable metal material, other suitable materials, or a combination thereof. For example, the liner layer 308 includes silicon, germanium, silicon germanium, other suitable semiconductor material, or a combination thereof. Alternatively, in some other embodiments, the liner layer 308 is made of aluminum, titanium, other suitable metal materials, or a combination thereof.

If the liner layer 308 is made of silicon, the liner layer 308 expands since it is transformed into a silicon oxide layer after being annealed. If the liner layer 308 is made of a metal material, the liner layer 308 may expand since it is transformed into a metal oxide layer after being annealed. Embodiments of the disclosure have many variations. For example, the liner layer 308 is not formed in some embodiments.

In some embodiments, the liner layer 308 is an amorphous silicon layer. In some other embodiments, the liner layer 308 is a polycrystalline silicon layer. In some embodiments, a thickness of the liner layer 308 is in a range from about 10 Å to about 40 Å. In some embodiments, the liner layer 308 is formed using a furnace system in a gaseous environment. The gaseous environment contains silicon containing gas, such as $Si_2H_6$, $Si_3H_3$, $SiCl_2H_2$, $Si_3Cl_3H$, other applicable silicon-containing precursors, or a combination thereof. Alternatively, in some other embodiments, the liner layer 308 is formed using other suitable processes, such as a CVD process.

Figure 1D:
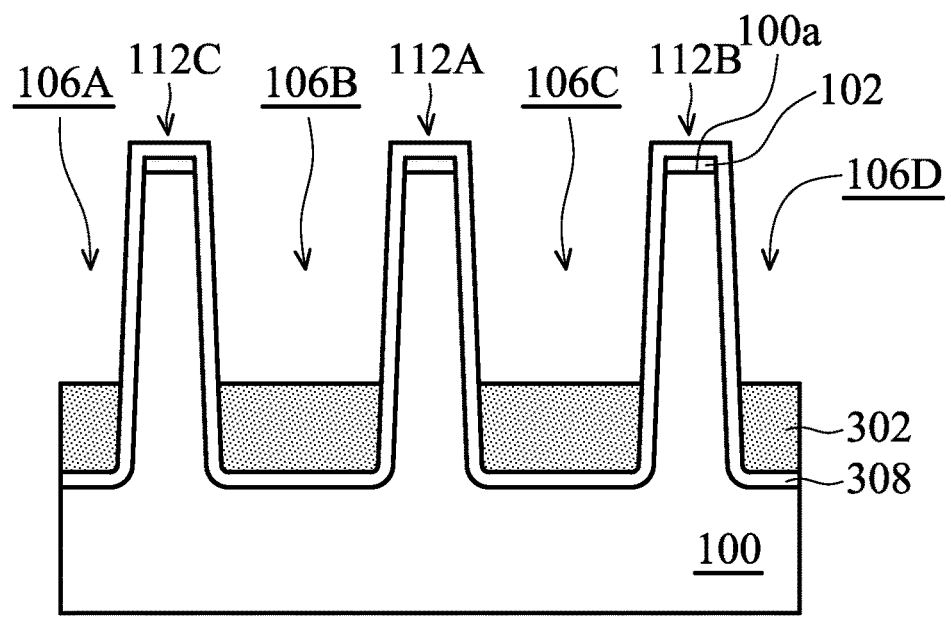

As shown in FIG. 1D, a base layer 302 is deposited in the recesses 106A, 106B, 106C, and 106D to surround lower portions of the active regions 112A, 112B, and 112C, in accordance with some embodiments. The base layer 302 may be used to hold or fasten the lower portions of the active regions 106A, 106B, 106C, and 106D so as to improve their structural stability. The base layer 302 may be made of any suitable material capable of improving the structural stability of the active regions 112A, 112B, and 112C. For example, the base layer is made of a non-conductive material. In some embodiments, the base layer 302 is made of a dielectric material. The dielectric material may include silicon oxide, silicon nitride, silicon oxynitride, other suitable dielectric materials, or a combination thereof.

In some embodiments, the base layer 302 is deposited using a spin-on process. The base layer 302 may be made of a spin on dielectric (SOD). The SOD may be a form of silicon oxide that is suspended in a silicon-containing solution. The SOD may be made from a silicate, a siloxane, a methyl SilsesQuioxane (MSQ), a hydrogen SilsesQuioxane (HSQ), an MSQ/HSQ, a perhydrosilazan (TCPS), a perhydro-polysilazane (PSZ), other suitable materials, or a combination thereof.

In some embodiments, the SOD is applied by dispensing a small amount of the silicon-containing solution onto a substrate that is spinning Most of the solvent or vehicle of the silicon-containing solution is then driven off the substrate surface during a low-temperature drying operation. The drying operation may also be called the bake operation. In some embodiments, the base layer 302 is heated at a temperature ranging from about 100 degrees C. to about 160 degrees C. for a duration ranging from about 70 seconds to about 100 seconds. The process of coating and drying SOD layers may be repeated until a sufficient amount of material has been built up to achieve the desired coverage and planarization. Embodiments of the disclosure have many variations. In some other embodiments, the base layer 302 is formed using other suitable methods. For example, the base layer 302 may be deposited using a CVD process or the like.

Embodiments of the disclosure have many variations. For example, the liner layer 308 is not limited to being deposited before the base layer 302 is deposited. In some other embodiments, the liner layer 308 is deposited after the base layer 302 is deposited. In some embodiments, the liner layer 308 is deposited on the base layer 302 and the sidewalls of the recesses 106A, 106B, 106C, and 106D. In some embodiments, multiple liner layers are formed, which may be under and/or over the base layer 302. In some embodiments, a liner layer is not deposited or formed in the recess(es).

In some embodiments, each of the aspect ratios of the recesses 106A, 106B, 106C, and 106D increase as the feature size of the semiconductor device continues to decrease. The aspect ratios may become high enough to make it challenging to fill the recesses 106A, 106B, 106C, and 106D with dielectric material. As a result, forming an isolation structure between the active regions 112A and 112B is difficult if the aspect ratios of the recesses 106A, 106B, 106C, and 106D are high.

In some embodiments, if the aspect ratio of the recess 106 is higher than a value such as about 8.5 or about 7, the deposited dielectric material may be prone to clogging at the top of the recesses 106A, 106B, 106C, and 106D before they are completely filled. As a result, voids or seams may be formed, for example, in the recess, including in a middle and/or lower region thereof. In some other embodiments, each of widths of the recesses 106A, 106B, 106C, and 106D is small, such as smaller than about 50 nm. In these cases, even if the aspect ratios of the recesses 106A, 106B, 106C, and 106D are small such as smaller than about 8.5 or about 7, it is also challenging to fill the recesses 106A, 106B, 106C, and 106D with dielectric material.

Figure 1E:
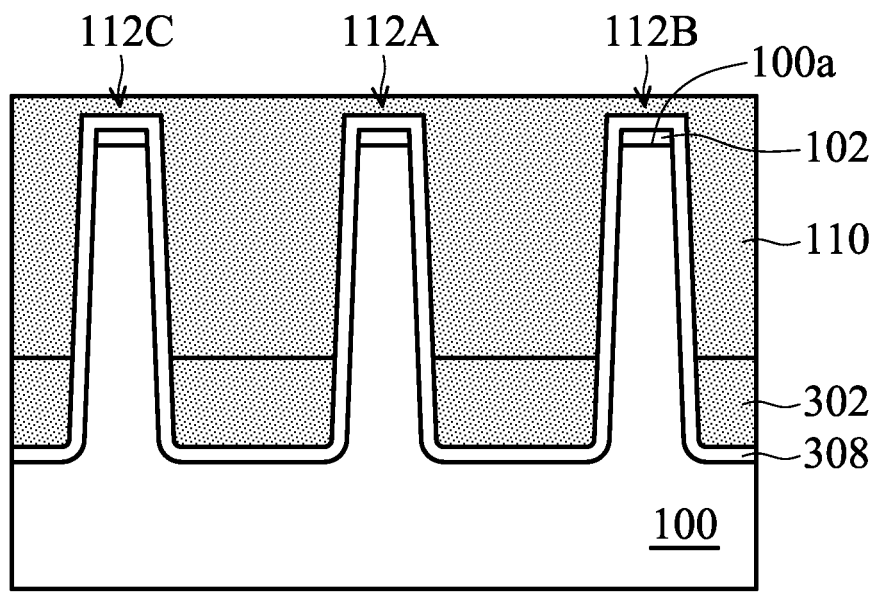

In some embodiments, a flowable chemical vapor deposition (FCVD) process is used to form isolation structures in the recesses 106A, 106B, 106C, and 106D to avoid or reduce the undesirable effects mentioned above. As shown in FIG. 1E, a flowable dielectric material layer 110 is deposited over the base layer 302 and the liner layer 308, in accordance with some embodiments. In some embodiments, the flowable dielectric material 110 overfills the recesses 106A, 106B, 106C, and 106D.

In some embodiments, the flowable dielectric material layer 110 includes a flowable silicon oxide layer or silicon nitride dielectric material. In some embodiments, a carbon-free silicon-containing precursor is mixed with a radical-nitrogen-and/or-hydrogen precursor in a process chamber designed to deposit the flowable material layer 110. The flowable material layer 110 is a silicon-nitrogen-and-hydrogen-containing layer in some embodiments.

In some embodiments, the carbon-free silicon-containing precursor includes a silicon-and-nitrogen precursor, a silicon-and-hydrogen precursor, a silicon-and-nitrogen-containing precursor, other suitable silicon-containing precursors, or a combination thereof. In some embodiments, the carbon-free silicon-containing precursor is also oxygen-free. In some embodiments, the carbon-free silicon-containing precursor includes silyl-amines. In some embodiments, the carbon-free silicon-containing precursor includes $N(SiH_3)_3$, $HN(SiH_3)_2$, $H_2N(SiH_3)$, other suitable precursors, or a combination thereof.

In some embodiments, the radical-nitrogen-and/or-hydrogen precursor is generated outside of the process chamber and delivered into the process chamber to mix with the carbon-free silicon-containing precursor. The radical-nitrogen-and/or-hydrogen precursor may be generated from a more stable nitrogen precursor. For example, the more stable nitrogen precursor contains $NH_3$, $N_2H_4$, $N_2$, other suitable precursors, or a combination thereof. In some embodiments, the more stable nitrogen precursor may be activated in a chamber plasma region or a remote plasma system outside of the process chamber to generate the radical-nitrogen-and/or-hydrogen precursor. Afterwards, the radical-nitrogen-and/or-hydrogen precursor is transferred into the process chamber.

In the process chamber, the carbon-free silicon-containing precursor and the radical-nitrogen-and/or-hydrogen precursor mix and react to form the flowable dielectric material, in accordance with some embodiments. The flowable dielectric material layer 110 has flowable characteristics. The flowable nature of the formation allows the flowable dielectric material layer 110 to flow into narrow gaps, trenches, recesses, or other similar structures formed or provided on the deposition surface of the substrate. In some embodiments, there is substantially no void or seam formed in the recesses 106A, 106B, 106C, and 106D filled with flowable dielectric material. In some embodiments, the flowable dielectric material layer 110 also fills some voids or seams formed in the base layer 302.

The flowability of the flowable dielectric material layer 110 may be due to a variety of properties which result from mixing the radical-nitrogen-and/or-hydrogen precursor with the carbon-free silicon-containing precursor. These properties may include a significant hydrogen component in the deposited film and/or the presence of short chained polysilazane polymers. These short chains may grow and network to form more dense dielectric material during and after the formation of the film.

When both the radical-nitrogen-and/or-hydrogen precursor and the carbon-free silicon-containing precursor are "carbon-free", the flowable dielectric material layer 110 is also substantially carbon-free. It should be appreciated that "carbon-free" does not mean the carbon-free silicon-containing precursor lacks even trace amounts of carbon. Carbon contaminants may be present in the precursor materials. The amount of these carbon impurities however is much less than that would be found in a silicon precursor having a carbon moiety, such as tetraethoxysilane (TEOS) or tetramethyldisiloxane (TMDSO).

After the deposition of the flowable dielectric material layer 110, the structure shown in FIG. 1E is cured in some embodiments. In some embodiments, the flowable dielectric material layer 110 is cured in an oxygen-containing atmosphere such as an ozone-containing atmosphere. The curing operation may reduce the concentration of nitrogen while increasing the concentration of oxygen in the flowable dielectric material layer 110. In some embodiments, the curing temperature of the curing operation is in a range from about 100 degrees C. to about 600 degrees C. For example, the curing operation is performed at a curing temperature ranging from about 150 degrees C. to about 250 degrees C. in an $O_3$ atmosphere.

Figure 1F:
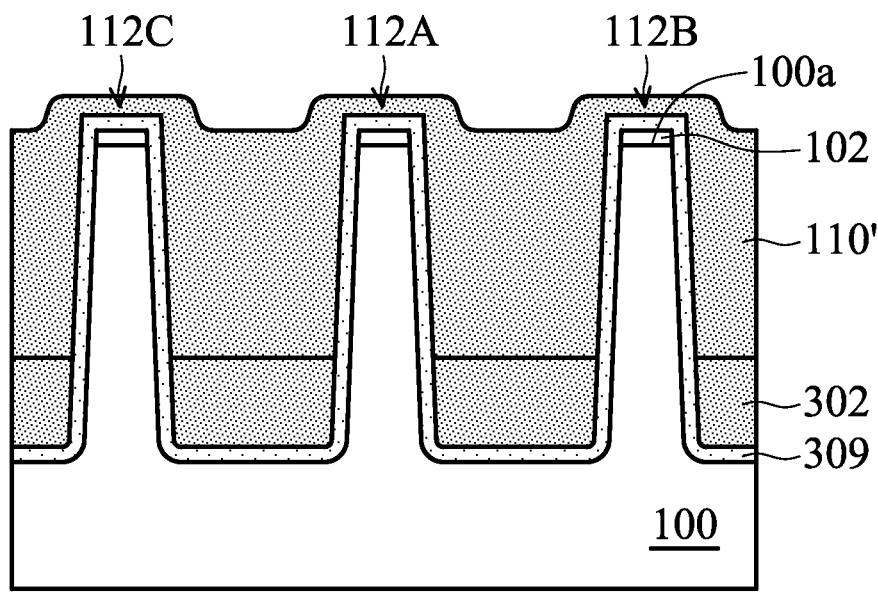

In some embodiments, an annealing operation is then performed to densify the flowable dielectric material layer 110 to form a dielectric layer 110', as shown in FIG. 1F. In some embodiments, the annealing operation is performed in an oxygen-containing atmosphere. In some embodiments, the annealing temperature of the annealing operation is in a range from about 700 degrees C. to about 1200 degrees C. For example, the annealing operation is performed at a temperature ranging from about 850 degrees C. to about 950 degrees C. in an oxygen atmosphere. In some embodiments, the dielectric layer 110' shrinks when compared to the flowable dielectric material layer 110. A shrinkage of the dielectric layer 110' may be in a range from about 15% to about 20%.

As shown in FIG. 1F, the liner layer 308 is converted into a dielectric layer 309, in accordance with some embodiments. In some embodiments, during the annealing operation, the liner layer 308 is converted into the dielectric layer 309 while the flowable dielectric material layer 110 shrinks as it densifies. The converted dielectric layer 309 expands in the recess 106 during the annealing operation. In some embodiments, the dielectric layer 309 and the dielectric layer 110' together fill the recesses 106A, 106B, 106C, and 106D completely to form isolation structures. The expansion of the dielectric layer 309 may compensate for the shrinkage of the dielectric layer 110'. In some embodiments, the liner layer 308 is a silicon layer. The silicon layer is oxidized to form the dielectric layer 309 which contains silicon oxide after the annealing operation.

In some cases, the expansion of the dielectric layer 309 and the shrinkage of the dielectric layer 110' may generate or impart stress on, for example, nearby or adjacent structures or features. In some embodiments, as feature size decreases, the sizes of the active regions 112A, 112B, and 112C also decrease. As a result, the structural strength of the active regions 112A, 112B, and 112C may be reduced accordingly. Therefore, the active regions between the isolation structures, formed using the flowable dielectric material layer, become more susceptible to tilting, bending, cracking or breakage during the formation of the isolation structures.

The structural strength of the active regions 112A, 112B, and 112C might not be sufficient to sustain or withstand the stress resulting, for example, from the process of forming the isolation structure(s). In some embodiments, the active region tilt and/or break. The tilt and/or the damage to the active regions may occur as a result of the stress generated, for example, during the annealing operation of the process for forming the isolation structures. The tilt and/or the damage to the active regions reduce the yield and the reliability of the semiconductor device.

In some embodiments, the base layer 302 is used to avoid and/or reduce the undesirable structural changes, such as tilting and/or breakage, mentioned above. In some embodiments, the base layer 302 surrounding the lower portions of the active regions provides the active regions with improved structural stability and strength. Even if high stress is generated because of the shrinkage of the dielectric layer 110' and the expansion of the dielectric layer 309, damage to the active regions 112A, 112B, and 112C are avoided or minimized. The base layer 302 is provided or formed to protect the active regions 112A, 112B, and 112C from tilting or being damaged during the annealing operation, in accordance with some embodiments.

In some embodiments, the annealing operation breaks down the silicate or the polysiloxane material of the base layer 302 to form a silicon oxide material. The annealing operation may remove some of carbon and hydroxyl groups from the base layer 302 to leave behind a solid dielectric such as silicon oxide. The departing carbon and hydroxyl species may leave behind pores in the hardened base layer 302. In some embodiments, the dielectric layer 110' is denser, or has higher density, than the base layer 302. In some embodiments, the number of pores in, or the porosity of, the base layer 302 is greater than the number of pores in, or porosity of, the dielectric layer 110'. However, embodiments of the disclosure are not limited thereto. In some other embodiments, the base layer 302 is denser than the dielectric layer 110'. In some other embodiments, the densities of the base layer 302 and the dielectric layer 110' are substantially the same.

In some embodiments, the materials of the base layer 302 and the dielectric layer 110' are different. For example, the base layer 302 may include a species. The concentration of the species of the base layer 302 is higher than that of the dielectric layer 110'. In some embodiments, the dielectric layer 110 includes only trace amounts of the species or does not include the species. In some embodiments, some carbon species remain in the base layer 302 after the annealing operation. The base layer 302 has a carbon concentration greater than that of the dielectric layer 110'. In some embodiments, there is substantially no carbon species in the dielectric layer 110' since a carbon-free silicon-containing precursor is used for forming the dielectric layer 110'. In some other embodiments, the dielectric layer 110' includes a second species. The concentration of the second species of the dielectric layer 110' is higher than that of the base layer 302. In some embodiments, the base layer 302 includes only trace amounts of the second species or does not include the species.

Figure 1G:
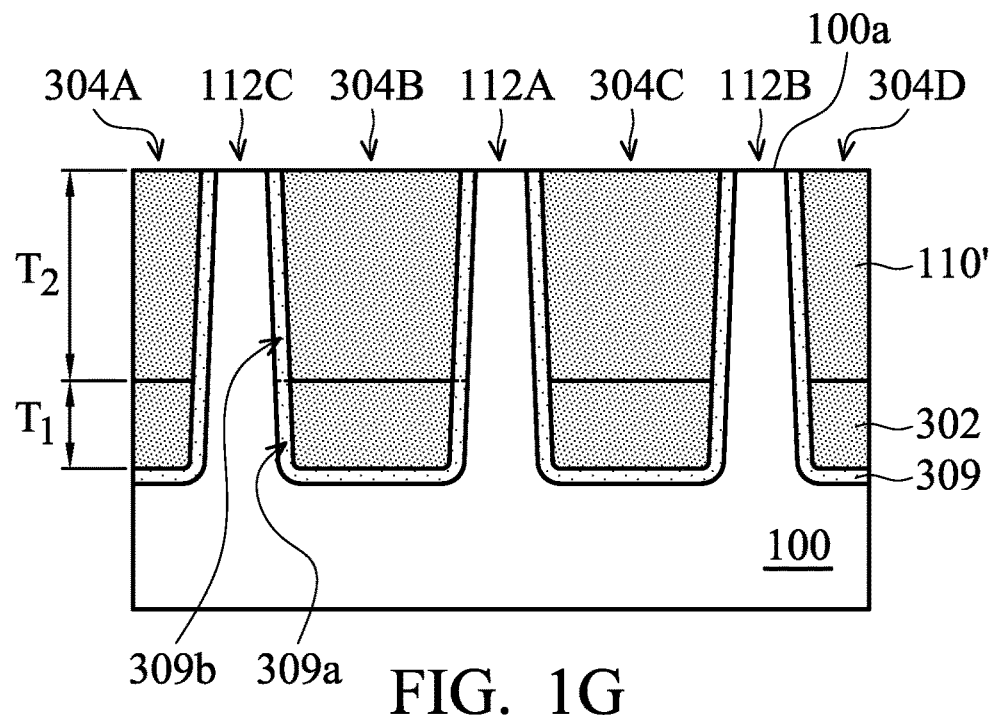

As shown in FIG. 1G, a planarization operation is performed to remove the mask layer 102, the dielectric layer 110', and the dielectric layer 309 outside of the recesses 106A, 106B, 106C, and 106D, in accordance with some embodiments. The planarization operation may include a chemical mechanical (CMP) process, a grinding process, an etching process, other applicable processes, or a combination thereof. As shown in FIG. 1G, isolation structures 304A, 304B, 304C, and 304D are formed between the active regions 112C, 112A, and 112B. Each of the isolation structures 304A, 304B, 304C, and 304D is constructed by portions of the dielectric layer 309, the base layer 302, and the dielectric layer 110'. The isolation structures 304A, 304B, 304C, and 304D are, for example, STI structures.

Embodiments of the disclosure have many variations. In some embodiments, one or more intermediate layers (not shown) are formed between the base layer 302 and the dielectric layer 110'. In some embodiments, one or more intermediate layers (not shown) are formed between the dielectric layer 309 and the base layer 302. In some embodiments, one or more intermediate layers (not shown) are formed between the dielectric layers 110' and 309. In some embodiments, the dielectric layer 110' includes multiple dielectric layers.

As shown in FIG. 1G, each of the isolation structures 304A, 304B, 304C, and 304D includes multiple portions such as a lower portion and an upper portion, in accordance with some embodiments. In some embodiments, the lower portion includes the base layer 302 and a portion 309a of the dielectric layer 309 surrounding the base layer 302. In some embodiments, the upper portion includes the dielectric layer 110' and a portion 309b of the dielectric layer 309 surrounding the dielectric layer 110'. As mentioned above, the dielectric layer 110' is denser than the base layer 302 in some embodiments. Therefore, for each of the isolation structures 304A, 304B, 304C, and 304D, the upper portion may be denser than the lower portion. In some embodiments, the lower portion contains more pores than the upper portion. The porosity of the lower portion is higher than that of the upper portion. In some embodiments, a continuous layer or film is formed or deposited to separate the dielectric layer 110' and base layer 302 from the active region(s) and/or substrate.

In some embodiments, the lower portion contains more carbon species than the upper portion. In some embodiments, the lower portion contains a concentration of carbon greater than that of the upper portion. In some embodiments, the upper portion has substantially no carbon species. In some embodiments, a Fourier transform infrared (FTIR) spectrometry or other applicable method is used to identify the existence of the carbon species.

As shown in FIG. 1G, the base layer 302 has a thickness $T_1$, and the dielectric layer 110' has a thickness $T_2$. In some embodiments, the thickness $T_1$ is in a range from about 400 Å to about 800 Å. In some embodiments, the thickness $T_2$ is greater than the thickness $T_1$. The thickness $T_2$ may be in a range from about 1400 Å to about 1800 Å. A thickness ratio of the thickness $T_1$ to the thickness $T_2$ ($T_1/T_2$) may be in a range from about 0.2 to about 0.6.

In some cases, if the thickness ratio ($T_1/T_2$) is lower than about 0.2, the base layer 302 might not be thick enough to provide sufficient protection to the active regions. As a result, some of the active regions may tilt or be damaged after the annealing operation of the dielectric layer 110'. In some cases, if the thickness ratio ($T_1/T_2$) is higher than about 0.6, the base layer 302 might be too thick, such that too many pores may be formed in the isolation structures to reduce the isolation quality.

However, it should be appreciated that embodiments of the disclosure are not limited to the embodiments described above. In some other embodiments, the thickness ratio ($T_1/T_2$) is lower than about 0.2. In some other embodiments, the thickness ratio ($T_1/T_2$) is higher than about 0.6. In some embodiments, the thickness ratio ($T_1/T_2$) is in a range from about 0.1 to about 0.8. In some other embodiments, the thickness ratio ($T_1/T_2$) is in a range from about 0.3 to about 0.5.

As shown in FIG. 1G, top surfaces of the isolation structures 304A, 304B, 304C, and 304D are substantially coplanar with top surfaces of the active regions 112A, 112B, and 112C, in accordance with some embodiments. However, it should be appreciated that embodiments of the disclosure are not limited thereto. In some embodiments, the top surfaces of the isolation structures 304A, 304B, 304C, and 304D are not coplanar with the top surfaces of the active regions 112A, 112B, and 112C. The active regions 112A, 112B, and 112C may protrude from the top surfaces of the isolation structures 304A, 304B, 304C, and 304D.

Figure 2:
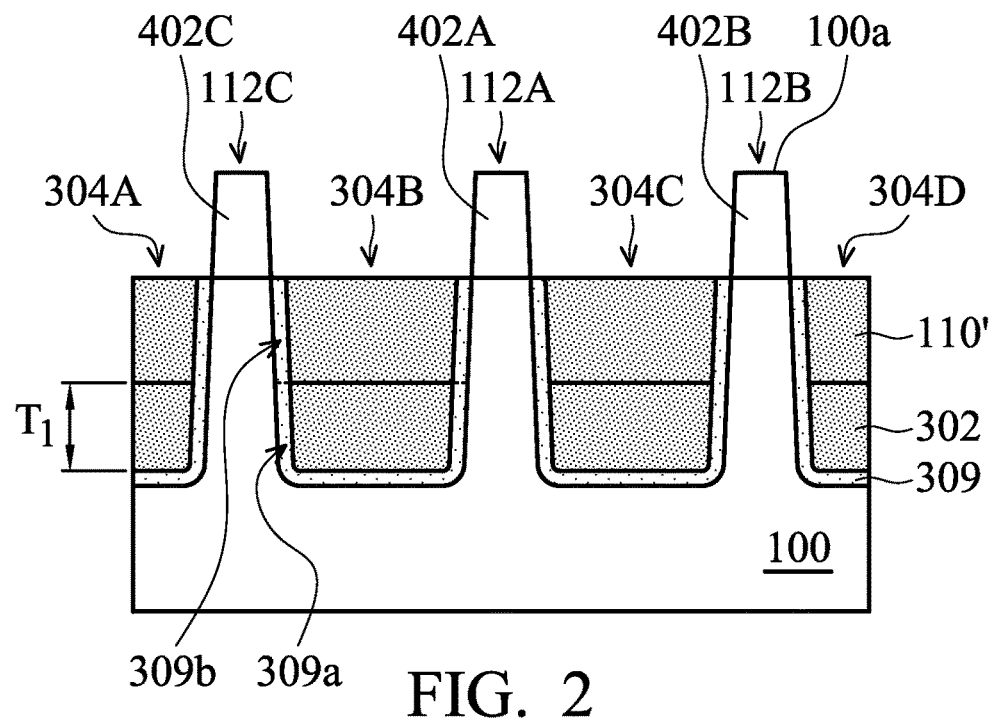
FIG. 2 is a cross-sectional view of a semiconductor device, in accordance with some embodiments.

FIG. 2 is a cross-sectional view of the semiconductor device, in accordance with some embodiments. A structure similar to that shown in FIG. 1G is provided. In some embodiments, an etching process is performed to remove a portion of the dielectric layers 110' and 309 so as to expose a portion of the active regions 112A, 112B, and 112C, as shown for example in FIG. 2. As a result, the active regions 112A, 112B, and 112C protrude from the top surfaces of the isolation structures 304A, 304B, 304C, and 304D. In some embodiments, the protruded active regions serve as semiconductor fins. As shown in FIG. 2, semiconductor fins 402A, 402B, and 402C protrude from the top surfaces of the isolation structures 304A, 304B, 304C, and 304D. Some processes are performed subsequently to form one or more fin field effect transistors (FinFETs) in some embodiments.

Embodiments of mechanisms for forming a semiconductor device having an isolation structure are provided. A base layer is deposited to fill a lower portion of a recess formed in a semiconductor substrate and surround the lower portion of active regions. The base layer is configured to hold or fasten the active regions. A flowable dielectric material layer is formed and used to fill the recess(es). An annealing operation is performed to densify the flowable dielectric material layer to form a dielectric layer. The active region(s) may experience high stress generated during the annealing operation. The active regions are protected from tilting or damage by the structural strength and stability provided by the base layer. As a result, yield, reliability and quality of the semiconductor device having the isolation structure of the present disclosure are improved.

In accordance with some embodiments, a semiconductor device is provided. The semiconductor device includes a semiconductor substrate having an upper surface. The semiconductor device also includes a recess extending from the upper surface into the semiconductor substrate. The semiconductor device further includes an isolation structure in the recess, and the isolation structure has an upper portion and a lower portion. The lower portion contains a concentration of carbon greater than that of the upper portion.

In accordance with some embodiments, a semiconductor device is provided. The semiconductor device includes a semiconductor substrate having an upper surface. The semiconductor device also includes a recess extending from the upper surface into the semiconductor substrate. The semiconductor device further includes an isolation structure in the recess, and the isolation structure has an upper portion and a lower portion. The lower portion contains more pores than the upper portion.

In accordance with some embodiments, a method for forming a semiconductor device is provided. The method includes providing a semiconductor substrate having an upper surface. The method also includes forming a recess in the semiconductor substrate. The method further includes forming a base layer in a lower portion of the recess and forming a flowable dielectric material layer over the base layer. In addition, the method includes performing an annealing operation to densify the flowable dielectric material layer to form a dielectric layer.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor device, comprising:
   providing a semiconductor substrate having an upper surface;
   forming a recess in the semiconductor substrate;
   spinning on a silicon-containing solution in the recess to form a base layer in a lower portion of the recess until an exposed surface of the base layer is formed between a bottom of the recess and a top surface of the semiconductor substrate, such that the recess is partially filled with the base layer once the base layer is formed;
   disposing a flowable dielectric material layer over the base layer such that the base layer contains a concentration of carbon greater than that of the flowable dielectric material layer, wherein the flowable dielectric material layer is deposited using a carbon-free silicon-containing precursor, and the flowable dielectric layer is substantially carbon-free; and
   after disposing the flowable dielectric material layer, performing an annealing operation to densify the flowable dielectric material layer to form a dielectric layer and to solidify the base layer,
   wherein a thickness ratio of the base layer to the dielectric layer is in a range from 0.2 to 0.6.

2. The method for forming a semiconductor device as claimed in claim 1, further comprising:
   forming a liner layer over sidewalls and a bottom of the recess before the flowable dielectric material layer is formed; and
   converting the liner layer into a second dielectric layer after the flowable dielectric material layer is formed.

3. The method for forming a semiconductor device as claimed in claim 2, wherein the liner layer is converted to the second dielectric layer during the annealing operation is performed.

4. The method for forming a semiconductor device as claimed in claim 1, further comprising curing the flowable dielectric material layer in an ozone-containing atmosphere before the annealing operation.

5. The method for forming a semiconductor device as claimed in claim 4, wherein a concentration of nitrogen in the flowable dielectric material layer is reduced while a concentration of oxygen in the flowable dielectric material layer is increased during the curing of the flowable dielectric material layer.

6. The method for forming a semiconductor device as claimed in claim 1, further comprising removing an upper portion of the dielectric layer such that an upper portion of the semiconductor substrate forms a semiconductor fin protruding above a top surface of the dielectric layer.

7. The method for forming a semiconductor device as claimed in claim 1, wherein the carbon-free silicon-containing precursor is oxygen-free.

8. The method for forming a semiconductor device as claimed in claim 1, further comprising mixing the carbon-free silicon-containing precursor with a radical-nitrogen precursor or a radical-hydrogen precursor.

9. The method for forming a semiconductor device as claimed in claim 8, wherein the radical-nitrogen precursor or the radical-hydrogen precursor is generated by activating a precursor containing $NH_3$, $N_2H_4$, $N_2$, or a combination thereof.

10. The method for forming a semiconductor device as claimed in claim 1, wherein the carbon-free silicon-containing precursor contains nitrogen.

11. The method for forming a semiconductor device as claimed in claim 1, further comprising planarizing the dielectric layer such that a top surface of the dielectric layer is coplanar with the upper surface of the semiconductor substrate.

12. A method for forming a semiconductor device, comprising:
   forming a recess in a semiconductor substrate;
   forming a base layer in a lower portion of the recess, wherein the base layer has a substantially flat top surface, the substantially flat top surface is an exposed surface, the base layer is formed using a spin-on process, and the spin-on process is performed until the substantially flat top surface is formed between a bottom of the recess and a top surface of the semiconductor substrate;
   forming a flowable dielectric material layer over the substantially flat top surface of the base layer to fill the recess, wherein the flowable dielectric material layer is deposited using a carbon-free silicon-containing precursor, wherein the base layer contains a concentration of carbon greater than that of the flowable dielectric material layer; and performing an annealing operation to densify the flowable dielectric material layer to form a dielectric layer, wherein a thickness ratio of the base layer to the dielectric layer is in a range from 0.2 to 0.6.

13. The method for forming a semiconductor device as claimed in claim 12, wherein the spin-on process comprises coating and drying a plurality of spin-on dielectric layers.

14. The method for forming a semiconductor device as claimed in claim 12, further comprising curing the flowable dielectric material layer in an ozone-containing atmosphere before the annealing operation.

15. The method for forming a semiconductor device as claimed in claim 14, wherein a concentration of nitrogen in the flowable dielectric material layer is reduced while a concentration of oxygen in the flowable dielectric material layer is increased during the curing of the flowable dielectric material layer.

16. The method for forming a semiconductor device as claimed in claim 12, wherein the carbon-free silicon-containing precursor is oxygen-free and contains nitrogen.

17. The method for forming a semiconductor device as claimed in claim 12, further comprising mixing the carbon-free silicon-containing precursor with a radical-nitrogen precursor or a radical-hydrogen precursor.

18. A method for forming a semiconductor device, comprising:

forming a recess in a semiconductor substrate;

repeatedly coating and drying spin-on dielectric layers to form a carbon-containing base layer in a lower portion of the recess until an exposed surface of the carbon-containing base layer is formed between a bottom of the recess and a top surface of the semiconductor substrate, wherein the drying of the spin-on dielectric layers comprises heating the spin-on dielectric layers at a first temperature;

forming a flowable dielectric material layer over the carbon-containing base layer to fill the recess, wherein the flowable dielectric material layer is deposited using a carbon-free silicon-containing precursor; and after forming the flowable dielectric material layer, performing an annealing operation at a second temperature to densify the flowable dielectric material layer to form a dielectric layer and to solidify the carbon-containing base layer, wherein the second temperature is higher than the first temperature, wherein a thickness ratio of the carbon-containing base layer to the dielectric layer is in a range from 0.2 to 0.6.

19. The method for forming a semiconductor device as claimed in claim 18, wherein the second temperature ranges from about 700 degrees C. to about 1200 degrees C., and the annealing operation is performed in an oxygen atmosphere.

20. The method for forming a semiconductor device as claimed in claim 18, wherein the first temperature is in a range from about 100 degrees C. to about 160 degrees C.

* * * * *